United States Patent [19]

Kato et al.

[11] Patent Number: 4,521,801
[45] Date of Patent: Jun. 4, 1985

[54] SEMICONDUCTOR DEVICE WITH COMPOSITE LEAD WIRE

[75] Inventors: Taketoshi Kato; Akira Onoe, both of Tokyo, Japan

[73] Assignee: Tokyo Shibaura Denki Kabushiki Kaisha, Kanagawa, Japan

[21] Appl. No.: 422,143

[22] Filed: Sep. 23, 1982

[30] Foreign Application Priority Data

Oct. 9, 1981 [JP] Japan ................. 56-160085

[51] Int. Cl.³ .................. H01L 23/36; H01L 23/54; H01L 23/14
[52] U.S. Cl. ......................... 357/71; 357/81; 357/67; 357/70; 174/52 FP; 174/16 HS
[58] Field of Search ............ 357/81, 80, 71, 67, 357/70, 68; 174/52 FP, 16 HS

[56] References Cited

U.S. PATENT DOCUMENTS

| | | | |
|---|---|---|---|
| 3,248,681 | 4/1966 | Reintgen | 357/67 |
| 3,311,798 | 3/1967 | Gray | 357/72 |
| 4,025,997 | 5/1977 | Gernitis et al. | 357/81 |

FOREIGN PATENT DOCUMENTS

| | | | |
|---|---|---|---|
| 31668 | 10/1979 | Japan | 357/71 |
| 90546 | 7/1981 | Japan | 357/68 |

OTHER PUBLICATIONS

"Clad Lead Frames Take Out More Heat", Lineback--Electronics-Aug. 11, 1981, pp. 38, 39.

Primary Examiner—Andrew J. James
Assistant Examiner—S. V. Clark
Attorney, Agent, or Firm—Cushman, Darby and Cushman

[57] ABSTRACT

A semiconductor device, for example a solar battery cell with a semiconductor element and a composite lead wire attached to the semiconductor element in which the lead wire includes a core and a cover overlying the core. The core has a lower thermal expansion coefficient than that of the semiconductor element, and the cover has a higher thermal expansion coefficient than that of the element and a higher electrical conductivity than that of the core. The lead wire therefore has substantially the same thermal expansion coefficient as that of the semiconductor element.

18 Claims, 19 Drawing Figures

SEMICONDUCTOR DEVICE WITH COMPOSITE LEAD WIRE

BACKGROUND OF THE INVENTION

The present invention relates to a semiconductor device with a semiconductor element and a composite lead wire or an electrode attached to the semiconductor element.

Many types of semiconductor devices, such as diodes, transistors, IC chips, LSI chips, laser diodes, photovoltaic generating devices and the like are widely used for various fields because of their compact size and their high efficiencies.

Referring now to FIGS. 1 and 2, as one example of the prior art semiconductor devices, a photovoltaic generating device, a so called solar battery cell, will be explained. A shallow n+ layer 1 is formed by diffusion or ion implantation in the upper surface of a p-silicon substrate 3. An n+ −p junction 4 is thereby formed less than 1 $\mu$m from the surface. On the entire rear surface of substrate 3, a back electrode 5 is formed on a p+ layer 6. Back electrode 5 is formed by deposition or plating of aluminum or silver. On the front, surface of the substrate, that is on n+ layer 1, fine collecting electrodes defining a grid 7 for collecting photovoltaic current and main collecting electrodes defining bus lines 8 are provided. Both grid 7 and bus lines 8 are formed by plating, depositing, or sintering. Bus lines 8 are formed thicker than grid 7. Both are formed so that the open area is 90% to 99% of the entire surface. The end 9 of bus line 8 is formed so as to be able to be connected to another photovoltaic generating element via a lead wire. On the entire surfaces of n+ layer 1, grid 7 and bus lines 8, an antireflection film 10 is formed so as to convert incident light 12 into electric power with high efficiency.

In a photovoltaic generating device as described above, grid 7 and bus lines 8 are made of highly electrically conductive material, for example silver. However, since the open space must be about 90% to 99%, as a result grid 7 and bus lines 8 have to be formed narrow. Therefore, grid 7 and bus lines 8 have to be thick to minimize electric resistance. However, a photovoltaic generating device having thickened bus lines 8, for example of thickness more than about 15 $\mu$m, tends to warp or crack since the difference in thermal expansion coefficient between the bus lines and a photovoltaic generating element made of silicon is relatively large. This occurs during the heat step of manufacturing or during the time the device is operating in the sunshine.

Accordingly, several proposals have been made for removing or reducing the above-described defect. Referring now to FIG. 3, circular grids 15 and radial grids 16 are provided instead of bus lines. The generated currents are collected at a center terminal 17 through radial grids 16, and the collected current is taken out by a mesh lead wire 19, which is connected to center terminal 17 and is made of, for example, silver. According to this structure, the mesh lead wire 19 is fixed to only one point at center terminal 17, so that the position of lead wire 19 is flexible. Thus, measuring the characteristics and inserting the device into a tool for the next step in manufacturing is inconvenient. This approach has the additional drawback of decreasing the photovoltaic generating ability because of the shading by lead wire 19.

Referring now to FIG. 4, in this device a bus line is not provided. Instead of the bus line, thin copper lead wires 27 of about 100 $\mu$m thickness are used. Bonding pads 22 connected to grid 26 are provided and copper lead wires 27 are fixed to bonding pads 22 by soldering. According to this device, the electric resistance can be decreased by using copper lead wire. The problem caused by the difference of the thermal expansion coefficient between copper lead wire 27 and photovoltaic generating element 28 made of Si can be avoided by fixing copper lead wire 27 with local bonding pads 22 with small area. However, when this device is attached to a protective glass panel by thermal press fitting using an organic sheet, thermal distortions are concentrated on bonding pads 22. Such thermal distortions may break the photovoltaic generating element or cause thermal fatigue. Furthermore a gap can be easily formed between the copper lead wire and the photovoltaic generating element. As a result, bubbles are produced under the organic sheet. Also the copper lead wires can contact the surface of the photovoltaic generating element, with the result that the surface of the photovoltaic element will be rubbed and the characteristics will deteriorate.

A semiconductor device handling large current, such as a thyristor, a transistor, a diode, etc., includes a stem and a semiconductor element mounted on the stem by soldering. The stem is made of highly electrically and thermally coundutive material, for example copper. A several times differential exists between the thermal expansion of the semiconductor element and that of the stem. This semiconductor device is exposed to a heat cycle during manufacturing and during operation. The heat cycle causes thermal fatigue which can result in peeling of the solder, and deterioration and break of the semiconductor element. If a semiconductor element is made of silicon, generally a tungsten or molybdenum electrode is provided as a buffer between the semiconductor element and the stem. Tungsten and molybdenum have approximately the same thermal expansion coefficient as silicon. However, tungsten and molybdenum are high in price and their electrical conductivities are about three times lower than that of copper. Because of the resistive heat produced by low conductivity, the current capacity is limited to a low level so as to keep the temperature below the permitted maximum value of the junction temperature, for example 150° C. in case of silicon semiconductor devices. The above-described factors are also applicable to a laser diode (a light emitting diode) using GaAs as a semiconductor element.

Furthermore an IC or an LSI device has a lead frame for mounting the chip. When the lead frame is made of copper of 250 $\mu$m in thickness, IC or LSI chips of size more than about 3.5 mm×3.5 mm may be broken because of the differential of the thermal expansion coefficient between the lead frame and the IC or the LSI chip. Therefore, in case of a relatively large size LSI chip, for example 8 mm×8 mm, the lead frame is made of alloy 42%Ni-Fe. However this alloy has one order of magnitude larger electrical resistance than copper and also has a larger thermal resistance of about 100° C./w compared with copper of about 40° C./w. Consequently, the current capacity must be reduced to keep the temperature below the permitted maximum value of the junction temperature.

SUMMARY OF THE INVENTION

A primary object of the present invention is to provide a semiconductor device which is resistant to warping or cracking.

Another object of the present invention is to provide a semiconductor device able to operate at high efficiency with high reliability.

Therefore the present invention provides a semiconductor device with a semiconductor element, and a lead wire or an electrode attached to the semiconductor element directly or indirectly. The lead wire or electrode has a first element with a lower thermal expansion coefficient than that of the semiconductor element; and a second element overlapped on the first element, which second element has a higher thermal expansion coefficient than that of the semiconductor element and a higher electrical conductivity than that of the first element.

BRIEF DESCRIPTION OF THE DRAWINGS

The invention will be described in detail with reference to the accompanying drawings, wherein.

DETAILED DESCRIPTION OF THE PREFERRED EMBODIMENT

Before describing the embodiments of the present invention, relations in a photovoltaic generating device, which is one type of semiconductor device, will be explained, more particularly the relation between the grid, the bus line and the efficiency of the photovoltaic generation.

In designing the grid and the bus line of a photovoltaic generating device, the serial resistance is calculated with Milnes' approximate formulation. The present inventors have calculated and measured the serial resistance of such a device.

Figure 1:
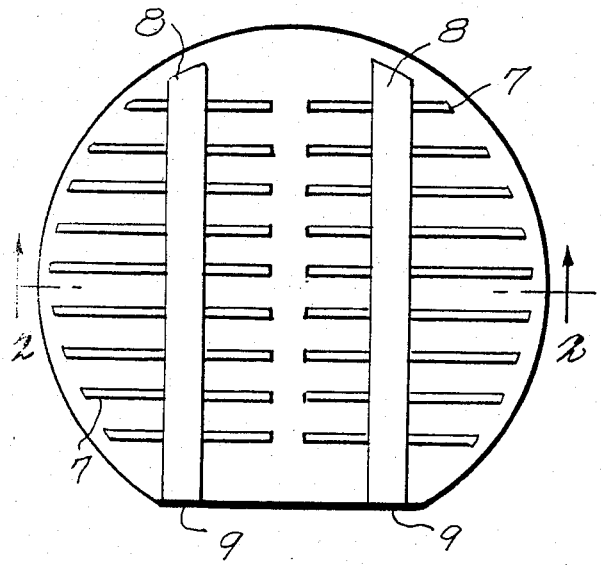
FIG. 1 is a top view of a conventional prior art photovoltaic generating device.
Figure 2:
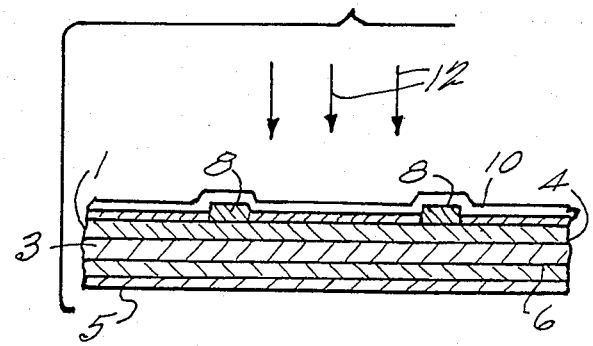
FIG. 2 is a sectional view taken along lines 2—2 of the device shown in FIG. 1.
Figure 3:
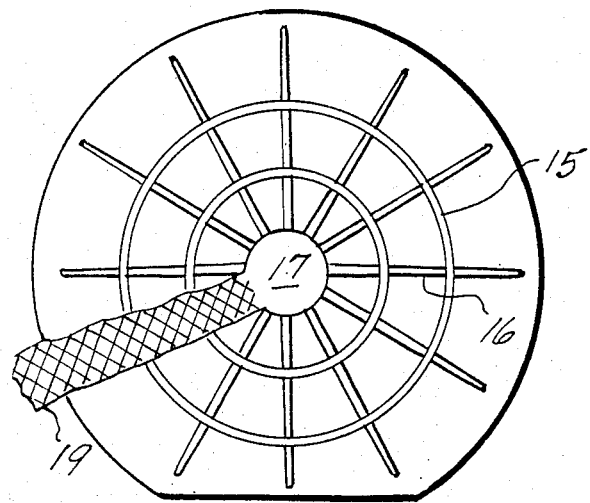
FIG. 3 is a top view of another conventional prior art photovoltaic generating device.
Figure 4:
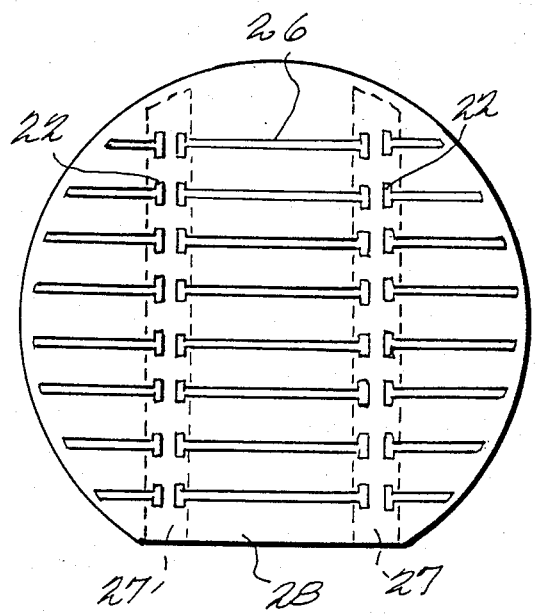
FIG. 4 is a top view of a further conventional prior art photovoltaic generating device.
Figure 5:
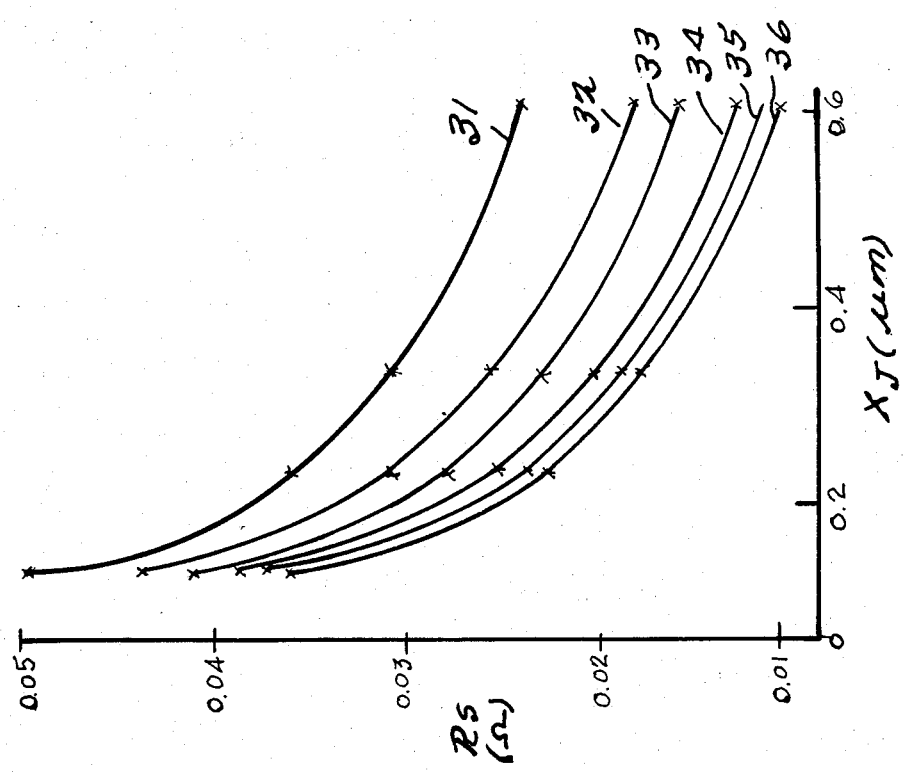
FIG. 5 is a chart showing that serial resistance of the photovoltaic generating device depends on the thickness of the bus line.

Referring now to FIG. 5, the relation between serial resistance (Rs) in ohms and distance (Xj) in $\mu$m between a surface and a junction as a function of a thickness of the bus line is shown. The measured photovoltaic generating device is similar to that shown in FIG. 4. The photovoltaic generating element is made of a p-type silicon wafer of impurity density $Ns = 2 \times 10^{20}/cm^3$, specific resistance $\rho = 1\Omega cm$, thickness $t = 300$ $\mu$m and diameter $D = 76$ mm. On the rear surface of the photovoltaic generating element is formed a silver electrode 30 $\mu$m in thickness, and on the front surface is formed a silver bus line 4 mm in width. The curve 31 denotes the case of 10 $\mu$m thickness of the bus line. The curves 32, 33, 34, 35 and 36 denote the values for 15 $\mu$m, 20 $\mu$m, 30 $\mu$m, 40 $\mu$m and 50 $\mu$m thicknesses, respectively. The x-marks denote the measured values and the curves are matched thereto. It can be understood from FIG. 5 that the thicker the bus line, the lower the serial resistance (Rs).

Figure 6:
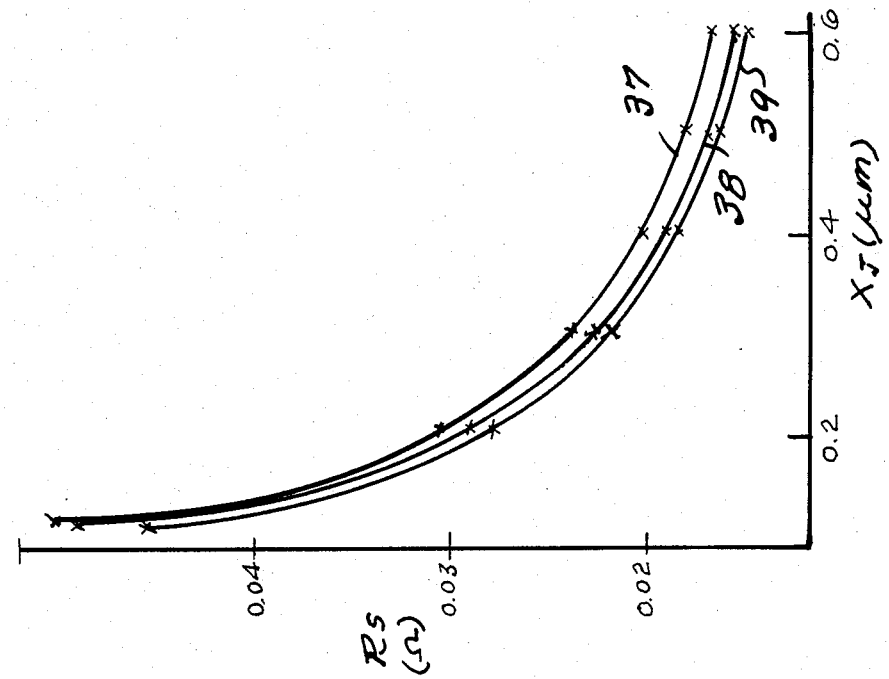
FIG. 6 is a chart showing that serial resistance of the device depends on the thickness of the grid.

FIG. 6 shows the relation between the serial resistance (Rs) and the junction depth (Xj) as a function of the thickness of the grid. The photovoltaic generating element is made of a p-type silicon wafer of impurity density $Ns = 2 \times 10^{20}/cm^3$, diameter $D = 76$ mm, specific resistance $\rho = 1\Omega m$. The bus line is made of silver and is 4 mm in width and 30 $\mu$m in thickness. The back electrode is made of silver and is 30 $\mu$m in thickness. The grid is made of silver and 300 $\mu$m in width and 4 mm interval. The curve 37 shows the case of 3 $\mu$m thickness of grid. Curve 38 shows 10 $\mu$m and curve 39 shows 30 $\mu$m. From FIG. 6, it can be understood that the thickness of the grid only slightly influences serial resistance.

Figure 7:
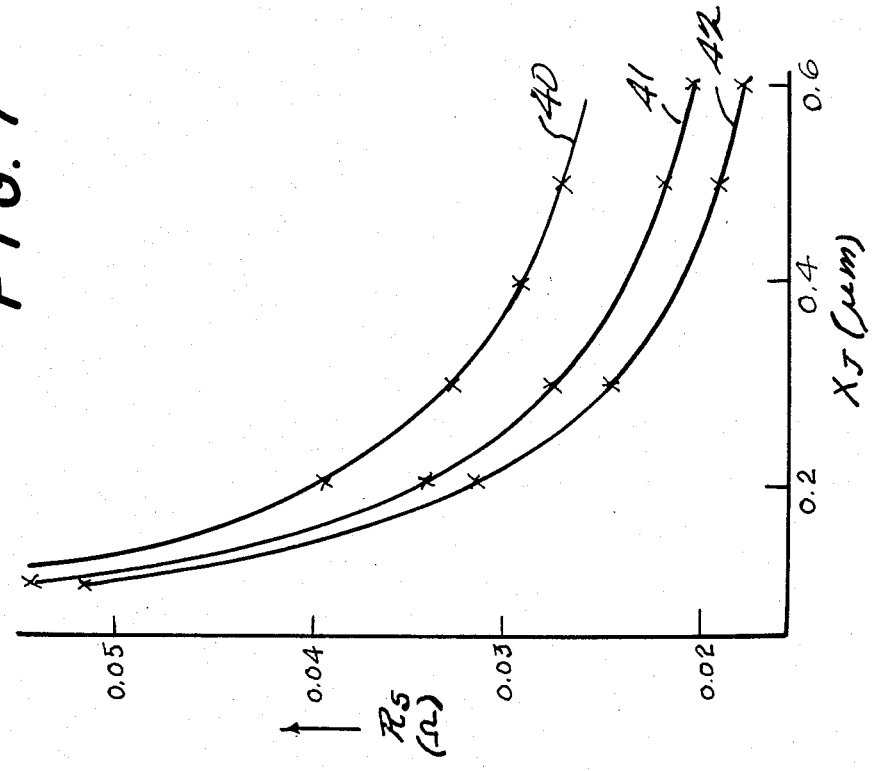
FIG. 7 is a chart showing that serial resistance of the device depends on the width of the bus line.

FIG. 7. shows the relation between serial resistance (Rs) and the junction depth (Xj) as a function of the width of the bus line. The photovoltaic generating element is made of a p-type silicon wafer of 76 mm in diameter, 300 $\mu$m in thickness, specific resistance $\rho = 1\Omega cm$, average $\rho t = 1.83 \times 10^{-3}$ cm ($Ns \simeq 2 \times 10^{20}/cm^3$). The back electrode is made of silver and 20 $\mu$m in thickness. The grid and the bus line are made of silver and 20 $\mu$m in thickness. The curve 40 shows the case of a bus line of 2 mm in width. Curve 41 shows 3 mm and curve 42 shows 4 mm. It can be understood from FIG. 7 that the wider the bus line, the lower the serial resistance.

Figure 8:
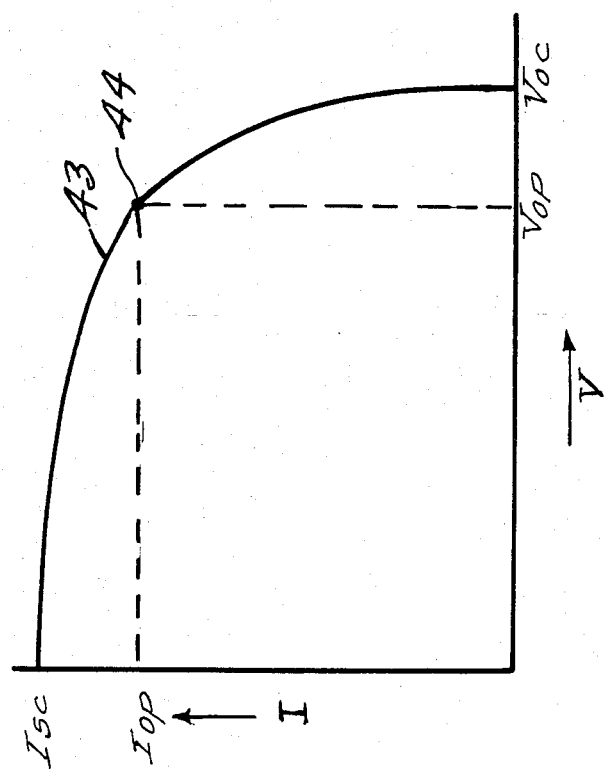
FIG. 8 is a chart showing the relation between output voltage and output current.

Further, the present inventors developed a calculation program, which program can derive the efficiency from a current-voltage characteristic curve. FIG. 8 shows a current-voltage characteristic curve 43 of a photovoltaic generating device. Voc is the open circuit voltage and Isc is a short circuit current. To obtain a maximum output power the point 44 corresponding to the maximum value of V-I product must be determined. At point 44, Vop is called the optimum voltage and Iop is also called the optimum current. According to the program developed by the inventors, the operating current Iop is determined from curve 43 as voltage V is gradually increased from Voc/2 to Voc and V×I is calculated.

Figure 9:
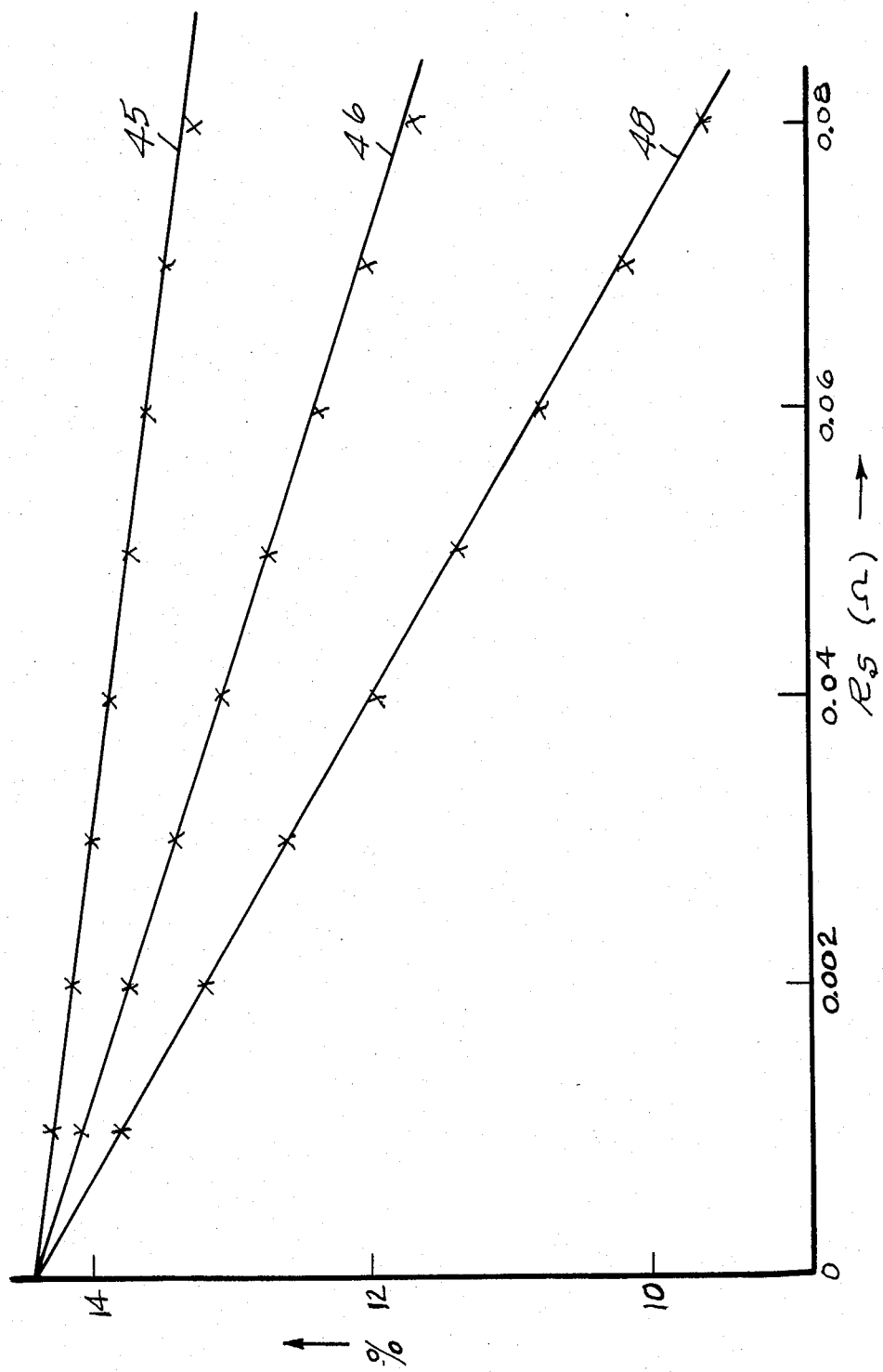
FIG. 9 is a chart showing that the converting efficiency depends on the size of the wafer and the serial resistance.

FIG. 9 shows the relation between the serial resistance (Rs) and the converting efficiency $\eta$ as a function of the area of the wafer. The curves 45, 46, and 47 are obtained from FIG. 8. Quality factor of diode $n=1$, output current $Io=5\times10^{-12}A/cm^2$, input power $W_{in}=100$. The curve 45 shows the case of a wafer 2 inches in diameter. Curve 46 shows a 3 inch diameter and curve 47 shows a 4 inch diameter. It can be understood from FIG. 9 that it is necessary to reduce the serial resistance (Rs) to increase the converting efficiency $\eta$ as the wafer size increases.

As discussed above, the serial resistance of the photovoltaic generating device largely depends on the width and the thickness of the bus line. The serial resistance largely determines the photovoltaic converting efficiency.

On the other hand, for preventing cracking the thermal expansion coefficient of the bus line should coincide with that of the photovoltaic generating element. If molybdenum or tungsten, which has approximately the same thermal expansion coefficient as silicon, is used as a bus line, the serial resistance becomes large and this is not practical.

EXAMPLE 1

Now the photovoltaic generation device according to the present invention will be described in detail with reference to the FIGS. 10, 11 and 12.

Figure 10:
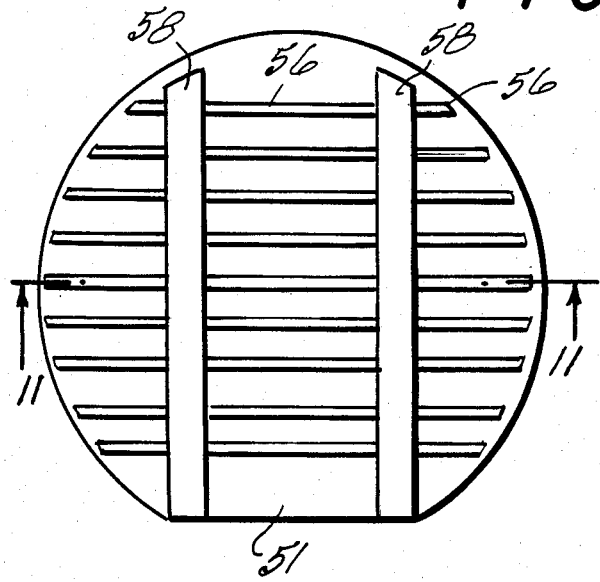
FIG. 10 is a top view of the photovoltaic generating device according to the present invention.
Figure 11:
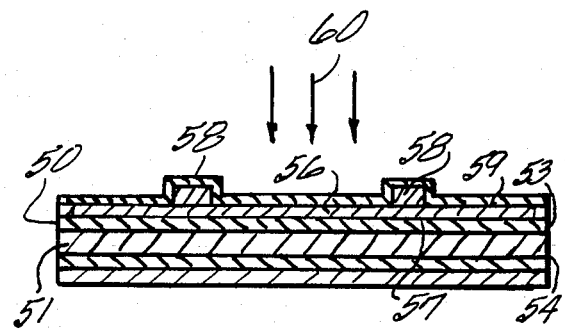
FIG. 11 is a cross section taken along lines 11—11 of the device shown in FIG. 10.

FIGS. 10 and 11 show a top view of the photovoltaic generating device according to the present invention and its cross section. A shallow n+ layer 50 is formed by diffusion or ion implantation into an upper surface of a p-type silicon substrate 51. An n+-p junction 53 is thereby formed less than 1 $\mu$m from the surface. On the rear surface a back electrode 54 is formed on a p+ layer 55. Back electrode 54 is formed by depositing or plating aluminum or silver. On the front surface, that is on n+ layer 50, grid 56 for collecting photovoltaic current and bus lines 57 are formed in thicknesses of 3 $\mu$m by plating, depositing, sintering, etc. Both the grid and the bus lines are locally formed so the open area is 90% -99% of the entire surface. To the bus line, lead wires 58 are fixed by solder. The width of lead wire 58 is equal to or less than that of the bus line. On the surfaces of n+ layer 50, grid 56 and lead wires 58, an anti-reflection film 59 is formed to convert incident light 60 into electric power with high efficiency.

Figure 12:
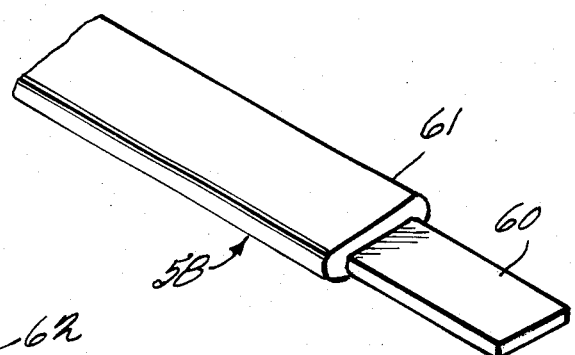
FIG. 12 is a perspective view of the lead wire according to the present invention.

FIG. 12 shows a perspective view of the lead wire employed in the present invention. Lead wire 58 has a core 60 as a first element and a cover 61 as a second element covering the core. Core 60 has lower thermal expansion coefficient than silicon. The thermal expansion coefficient of silicon is usually given as $3.5\times10^{-6}/°C$. but the value can vary depending on different factors. Cover 61 has higher electrical conductivity than the core and has a higher thermal expansion coefficient than silicon. The core is made of Invar (alloy of about 36% Ni-Fe, of which thermal expansion coefficient is $0.8\times10^{-6}/°C$.) and the cover is made of silver. The lead wire is made as follows. An Invar sheet of 85 $\mu$m thickness is cut into Invar ribbons. The Invar ribbon which forms the core is plated with nickel. Then silver forming a cover is plated on the surface of the core in 12.5 $\mu$m thickness. The thermal expansion coefficient of this lead wire 58 is $5.9\times10^{-6}°C$. and is substantially the same as that of silicon. The photovoltaic generating device employing this lead wire indicates efficiency of 13.9% and an assembly yield of 99%. This photovoltaic generating device does not indicate deterioration after a 100 hours heat cycle test changing the temperature between $-60°$ C. to $+90°$ C. in two hours.

For a comparison, another lead wire is employed. This lead wire has a core of 42% Ni-Fe alloy (thermal expansion coefficient=$4.9\times10^{-6}/°C$.) for 40 $\mu$m thickness. The core is plated with nickel, and then further plated with copper of 30 $\mu$m thickness. The thermal expansion coefficient of this lead wire is $11.5\times10^{-6}/°C$. The photovoltaic generating device employing this lead wire indicates deterioration after the above-mentioned heat cycle test.

EXAMPLE 2

The core of the lead wire is made of an amorphous ribbon of 81 ~85% Fe—5% Si—10% Cr-B alloy formed by rapid quenching with a thickness of the core of about 40 $\mu$m. The thermal expansion coefficient of the core is about $0.9\times10^{-6}/°C$. The core is covered with copper forming a cover by rapid quenching.

The lead wire has a thermal expansion coefficient of $6.9\times10^{-6}/°C$. The lead wire is attached to the same photovoltaic generating element described in Example 1. The ferromagnetic transition temperature of this lead wire can be increased to about 200° C. compared to 150° C. level of the lead wire of Example 1. The photovoltaic generating device of this embodiment can endure a large thermal differential. Consequently, the heat fatigue resistance is improved.

EXAMPLE 3

The photovoltaic generating device has the same photovoltaic generating element described in FIG. 4. The lead wire also has a core and a cover. The core is made of about 32% Ni—4% Co—Fe (so-called Super Invar) and a thermal expansion coefficient is $0.1\times10^{-6}/°C$. of 75 $\mu$m thickness. After plating with nickel, the core is plated with copper to a thickness of about 12.5 $\mu$m. This lead wire has a thermal expansion coefficient of $4.0\times10^{-6}/°C$.

EXAMPLE 4

Figure 13:
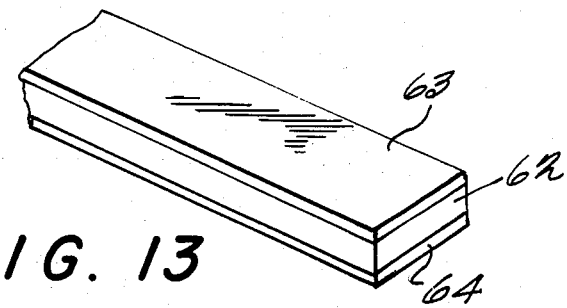
FIG. 13 is a perspective view of the lead wire of another embodiment.

The photovoltaic generating device includes the same photovoltaic generating element described in Example 1. The lead wire is made by follows. A Super Invar sheet of 500 $\mu$m thickness is plated with nickel, then copper is plated on both surfaces of the sheet to a thickness of 12.5 $\mu$m. The plated sheet is cut into a ribbon lead wire. FIG. 13 shows a perspective view of this lead wire. The lead wire has a first element 62 of Super Invar and second and third elements 63 and 64 of copper. The lead wire has a thermal expansion coefficient of $0.96\times10^{-6}/°C$. The result is satisfactory for photovoltaic generating efficiency and assembly yield.

EXAMPLE 5

Figure 14:
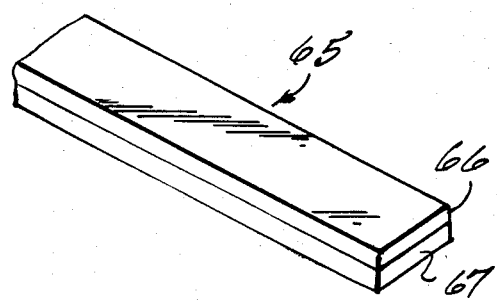
FIG. 14 is a perspective view of the lead wire of yet another embodiment.

The photovoltaic generating device includes the same phtovoltaic generating element described in Example 1. Referring now to FIG. 14, lead wire 65 has a first element 66 of 36% Ni-Fe alloy of 55 $\mu$m thickness and a second element 67 of copper of 45 $\mu$m thickness. First and second elements 66 and 67 are cladded. Second element 67 is attached to the bus line of the photovoltaic generating element by soldering. This lead wire has a thermal expansion coefficient of $7.0\times10^{-6}/°C$. In this device, no cracking in the photovoltaic generating device during manufacturing was discovered.

EXAMPLE 6

Figure 15:
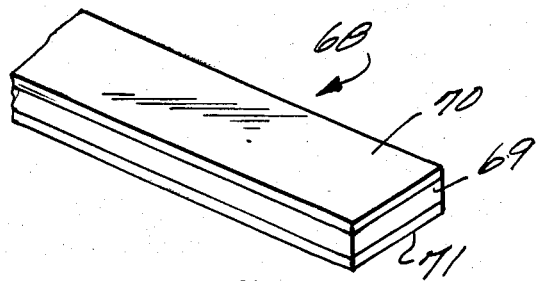
FIG. 15 is a perspective view of the lead wire of a further embodiment.

This photovoltaic generating device has the same photovoltaic generating element described in Example 3. Referring now to FIG. 15, lead wire 68 comprises a first element 69, a second element 70 and a third element 71. First element 69 is made of copper ribbon of 45 μm thickness, and second and third elements 70 and 71 are made of 36% Ni-Fe of 25 μm thickness, and they are cladded into a united structure. This embodiment share the good characteristics of Example 2.

According to the present invention it should be understood that an alloy of 39% Ni-Fe (thermal expansion coefficient: $3.0 \times 10^{-6}$) is applicable as an element having a lower thermal expansion coefficient than the semiconductor element. Furthermore, the raw materials described above are utilized without annealing treatment. Non-annealed material has a lower thermal expansion coefficient than annealed material. For example, non-annealed 36% Ni-Fe alloy has a thermal expansion coefficient of $0.29 \times 10^{-6}$°C. Gold (electrical conductivity: $2.44 \times 10^{-6} \Omega cm$) and aluminum (electrical conductivity: $2.8 \times 10^{-6} \Omega cm$) can be used as elements having higher thermal expansion coefficients than the semiconductor element and having higher electrical conductivity than the other element.

When material having a lower thermal expansion coefficient than that of silicon is used as one element of the lead wire, a good lead wire is obtained. The reason is that the other element, which is made of high electrical conductivity material, for example, gold and silver, has a larger thermal expansion coefficient than that of silicon. Thus the thicknesses of the core and the cover are selected to the desired value, and the thermal expansion coefficient of the lead wire can be adjusted to substantially the same as that of silicon.

In a photovoltaic generating device as known from FIG. 9, as the size of the photovoltaic generating element is increased, the serial resistance increases and the efficiency decreases. Thus an element having higher conductivity is usually made thicker so as to reduce the serial resistance. However increasing the thickness is limited by the thermal expansion coefficient problem noted above.

According to the present invention, the bus line need not be formed so thick as 20 μm and lengthy deposition or plating is eliminated. Any break due to warping or increase of dark current due to warping are eliminated and the assembly yield and efficiency of the photovoltaic conversion are increased.

The lead wire according to this embodiment is harder than conventional copper lead wire. Even if the lead wire is soldered to the bonding pads of a grid, as shown in FIG. 4, and the photovoltaic generating element is attached to the protective glass panel through the organic sheet by hot press fitting, breaking or thermal fatigue of the photovoltaic generating device and resultant deterioration will not occur.

It should be understood that the described lead wire can be applied to the back electrode even though a lead wire corresponding to the bus line is described.

Further embodiments of the present invention will be described below.

EXAMPLE 7

Figure 16:
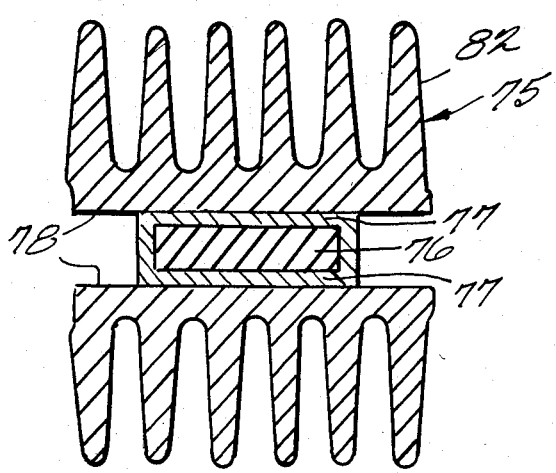
FIG. 16 is a cross section of the second embodiment of the present invention.
Figure 17:
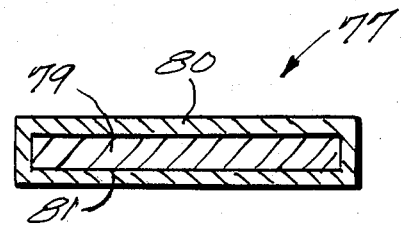
FIG. 17 is an enlarged cross section of the electrode of the second embodiment.

Referring now to FIG. 16, diode device 75 handles large current, and comprises a silicon semiconductor element 76 having a p-n junction, electrodes 77 fixed to silicon semiconductor element 76 by an alloy containing gold or aluminum and stems 78 having radiators 82 attached to electrodes 77. FIG. 17 shows an electrode 77 with a first element 79 and second and third elements 80 and 81 attached to both surfaces of first element 79, respectively. First element 79 is made of an alloy of about 36% Ni-Fe. Second and third elements 80 and 81 are made of silver and they are formed by plating. The electrode is formed to have substantially the same thermal expansion coefficient as silicon by selecting the thicknesses of the first, second and third elements.

According to this embodiment, high cost material such as molybdenum and tungsten becomes unnecessary. Therefore, a semiconductor device of high quality can be provided at a cheap price.

According to the present invention, electrode 77 can be made by cladding instead of plating. Furthermore, other materials, which are employed in the photovoltaic generating devices, are also applied to the diode device. For example, the core materials are applied to the first element and the cover materials are also applied to the second and third elements.

EXAMPLE 8

Figure 18:
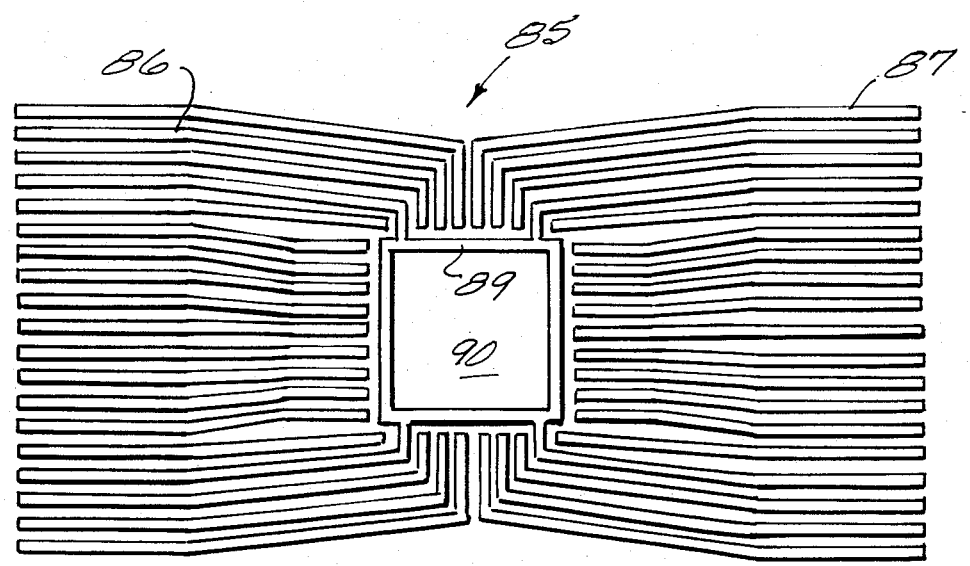
FIG. 18 is a top view of the third embodiment.
Figure 19:
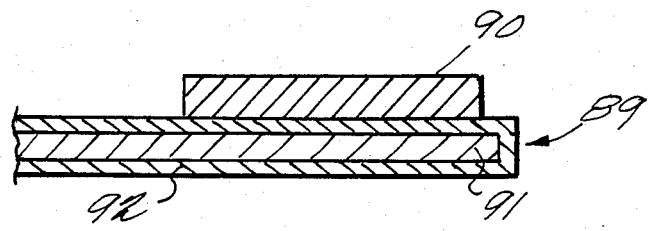
FIG. 19 is an enlarged cross section of the third embodiment.

Referring now to FIG. 18, LSI device 85 includes a lead frame 86 having a plurality of lead wires 87 and a mounting electrode 89 connected to one of the lead wires, and an LSI element 90 mounted on the mounting electrode. LSI device 85 further has bonding wires connecting the bonding pads of the LSI element to the lead wires, and a mold molding the LSI element (not shown). Mounting electrode 89 has first and second elements 91 and 92. First element 91 is made of about 36% Ni-Fe alloy. Second element 92 is made of silver or copper. Second element 92 is formed by plating on the first element after nickel is plated on the first element. Also in this embodiment, the first element has a lower thermal expansion coefficient than the LSI element, and the second element has a higher electrical conductivity than the first element and has a higher thermal expansion coefficient than the LSI element. The mounting electrode has substantially the same thermal expansion coefficient as the LSI element.

In case of 200 μ thickness of the first element and 25 μm thickness of the second element, the mounting electrode has a thermal resistance of 80° C./w and can mount an LSI element of 8 m × 8 mm without cracking. A conventional mounting electrode, which is made of 42% Ni-Fe alloy of 250 μm thickness has a thermal resistance of 100° C./w, provides unsatisfactory cooling of such an LSI element. Furthermore, the mounting electrode which is comprised of a 200 μm thickness first element of 42% Ni-Fe and 25 μm thickness second element, has a thermal resistance of 80° C./w. However, this mounting electrode has a large thermal expansion coefficient and cannot mount a larger size LSI element than about 5 mm × 5 mm.

In the LSI or IC device according to the present invention, other materials, which are described in the photovoltaic generating device according to the present invention, can be employed as the diode.

It should be understood that the present invention is applicable to transistors and thyristors, which use a silicon substrate, and laser devices (includes a light emitting diode), which use a garium arsenic substrate, even though a photo electrical converting device, a diode device and LSI device are described.

Thus the present invention provides a semiconductor device having improved characteristics, life and manufacturing yield rate.

While the invention has been described in connection with what is presently considered to be the most practical and preferred embodiment, it is to be understood that the invention is not to be limited to the disclosed embodiments but on the contrary, is intended to cover various modifications and equivalent arrangements included with the spirit and scope of the appended claims which scope is to be accorded the broadest interpretation so as to encompass all such modifications and equivalent structures.

What is claimed is:

1. A semiconductor device comprising:
   a semiconductor element of silicon; and
   conducting means attached to said semiconductor element including a first element having a lower thermal expansion coefficient than that of said semiconductor element and a second element overlapping said first element, and having a higher thermal expansion coefficient than that of said semiconductor element and having a higher electrical conductivity than that of said first element, said first element being made of one material selected from the group consisting of an alloy of about 36% Ni-Fe, an alloy of abut 39% Ni-Fe, an alloy of about 32% Ni - and about 4% Co-Fe, and an alloy of 81 to 85% Fe - about 5% Si - and about 10% Cr-B made by rapid quenching.

2. A semiconductor device according to claim 1, wherein said conducting means has substantially the same thermal expansion coefficient as that of said semiconductor element.

3. A semiconductor device according to claim 1, wherein said second element is made of a material selected from the group consisting of Au, Ag, Cu and Al.

4. A semiconductor device according to claim 1, wherein said conducting means further comprises a third element made of the same material as said second element, with said first element sandwiched between said second and third elements.

5. A semiconductor device according to claim 1, wherein said conducting means further comprises a third element made of the same material as said first element, and said second element is sandwiched between said first and third elements.

6. A semiconductor device according to claim 1, wherein said conducting means comprises a core and a cover covering said core, said first element comprising said core and said second element comprising said cover.

7. A semiconductor device according to claim 1, wherein said conducting means comprises a core and a cover covering said core, said second element comprising said core and said first element comprising said cover.

8. A semiconductor device according to claim 1, wherein said semicoductor element comprises a photovoltaic element.

9. A semiconductor device according to claim 1, wherein said semiconductor element comprises a semiconductor chip and said conducting means is a mounting electrode mounting said chip.

10. A semiconductor device according to claim 1, wherein said semiconductor device further comprises a stem, and said conducting means is an electrode interposed between said stem and said semiconductor element.

11. A semiconductor device comprising:
    a semiconductor element of silicon having first and second surfaces and having a p-n junction for photovoltaic generation;
    a grid provided on said first surfae of said semiconductor element, which grid includes a plurality of fine electrodes;
    a lead wire electrically connected to said grid, which lead wires comprises a first element and a second element overlapped on said first element, said first element having a lower thermal expansion coefficient than that of said semiconductor element, said second element having a higher thermal expansion coefficient than that of said semiconductor element and having higher electrical conductivity than that of said first element, said first element being made of one material selected from the group consisting of an alloy of about 36% Ni-Fe, an alloy of about 39% Ni-Fe, an alloy of about 32% Ni - and about 4% Co-Fe, and an alloy of 81 to 85% Fe - about 5% Si - and about 10% Cr-B made by rapid quenching; and
    a back electrode provided on said second surface of said semiconductor element.

12. A semiconductor device according to claim 11, wherein said semiconductor device further comprises bonding pads provided on said first surface of said semiconductor element and electrically connected to said grid, with said lead wire connected to said bonding pads.

13. A semiconductor device according to claim 11, wherein said semiconductor device further comprises a bus line provided on said first surface of said semiconductor element and electrically connected to said grid, with said lead wire connected to said bus line.

14. A semiconductor device according to claim 13, wherein said grid and said bus line are made of the same material.

15. A semiconductor device according to claim 14, wherein said semiconductor device further comprises a solder between said bus line and said lead wire so that and said solder bonds said lead wire to said bus line.

16. A semiconductor device according to claim 11, wherein said lead wire has substantially the same thermal expansion coefficient as that of said semiconductor element.

17. A semicnductor device according to claim 11, wherein said lead wire comprises a core and a cover covering said core, said first element comprising said core and said second element comprising said cover.

18. A semiconductor device according to claim 11, wherein said second element is made of one material selected from the group consisting of Au, Ag, Cu and Al.

* * * * *